THIN FILM TUNNELING DEVICE

Filed May 11, 1965

*INVENTOR.*
WINSTON E. KOCK
*BY* Richard I. Seeger
ATTORNEY

April 22, 1969 W. E. KOCK 3,440,453

THIN FILM TUNNELING DEVICE

Filed May 11, 1965 Sheet 2 of 2

INVENTOR.
WINSTON E. KOCK

BY

Richard J. Sager
ATTORNEY

United States Patent Office 3,440,453
Patented Apr. 22, 1969

3,440,453

THIN FILM TUNNELING DEVICE

Winston E. Kock, Beverly Farms, Mass., assignor to The Bendix Corporation, Southfield, Mich., a corporation of Delaware Continuation-in-part of application Ser. No. 80,455, Jan. 3, 1961. This application May 11, 1965, Ser. No. 461,577
Int. Cl. H03k 19/10; H01l 3/00, 11/00
U.S. Cl. 307—298 19 Claims

ABSTRACT OF THE DISCLOSURE

A thin film device, having a tunneling barrier of finite length and of varying effective thickness between a pair of noninsulative plates, with a voltage being applied between the plates to establish a carrier current flow across the barrier and with conductivity of the device being controlled by varying a potential gradient which is established along the length of the barrier via one of the plates. The purpose of the foregoing abstract is to enable the Patent Office and the public generally, and especially the scientists, engineers, or practitioners in the art who are not familiar with patent or legal terms or phraseology, to determine quickly from a cursory inspection the nature and essence of the technical disclosure of the application. The abstract is neither intended to define the invention of the application, which is measured by the claims, nor is it intended to be limiting as to the scope of the invention in any way.

This invention pertains to a high carrier concentration solid state device, and, more particularly, to a device that is constructed so that conduction occurs according to the "tunneling" concept. This is a continuation-in-part of my previous application entitled, "High Carrier Concentration Solid State Device," Ser. No. 80,455, filed Jan. 3, 1961, now abandoned.

This invention is an improvement over the tunnel or Esaki diode which uses heavily doped N and P layers resulting in conduction due to electrons in the conduction band in one layer moving directly across a narrow junction to the valance band of the other layer. The tunneling electron transport proceeds with velocities approaching that of light in the same manner that a signal is carried by the free electrons in a conductor, that it is not limited, as in the transistor, by effects of carrier lifetimes (or diffusion distances). Amplification of tunnel diodes is accomplished by virtue of their negative resistance characteristics which exist in the forward bias region where the tunneling mechanism is decreasing and the electron injection process is still relatively negligible. The tunnel or Esaki diode does not have precise control over the current gain through the diode, and has only two terminals which makes difficult the diode's use for certain purposes such as cascading diodes to form multiple amplifier stages.

This invention improves over the tunnel diode by varying the junction "thickness" between the N and P layers and placing one terminal at the center of one layer and two terminals, one at each corner, on the other layer, which is a relatively thin layer. The junction thickness is a term used to designate the concentration of impurity doping along the junction. The heavier doped or "narrow" areas provide an easier path of carrier travel than the lighter doped or "wide" areas. By connecting the input across the two terminals of the relatively thin layer, an output is provided between the terminal of the one layer and a terminal of the thin layer. Accurate gain is provided since the input voltage will control at what level of the junction the current will pass, with different levels being of different thicknesses or impurity concentration. The thicker the junction, or lower impurity concentration of the junction, through which the current passes, the lower will be the current value in the output circuit for a given bias voltage, so that a direct and accurate relationship is provided between input and output.

It is, therefore, an object of this invention to provide a semiconductor device of heavily doped N and P layers which operates on the tunneling concept, which has an accurately controlled gain, and which has three terminals.

It is a object of this invention to provide a semiconductor device which has a junction of gradually increasing impurity concentration between heavily doped N and P layers, a terminal being connected at each corner of one of said layers, which is a relatively thin layer compared to the other of said layers, and a terminal connected to the other layer, means for supplying an input across the two terminals connected to the thin layer and an output being provided between the terminal connected to the other layer and one of the terminals connected to the thin layer.

These and other objects will become more apparent when a preferred embodiment is described in connection with the drawings in which.

Figure 1:
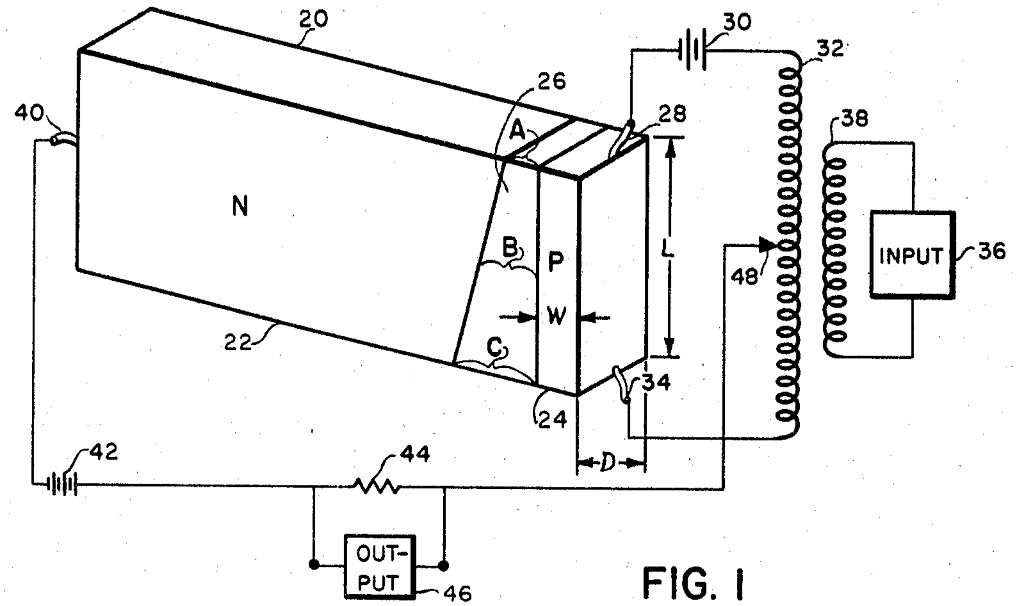
FIGURE 1 is a view in perspective of a preferred embodiment of this invention with the junction between the N and P layers being symbolically shown.
Figure 3:
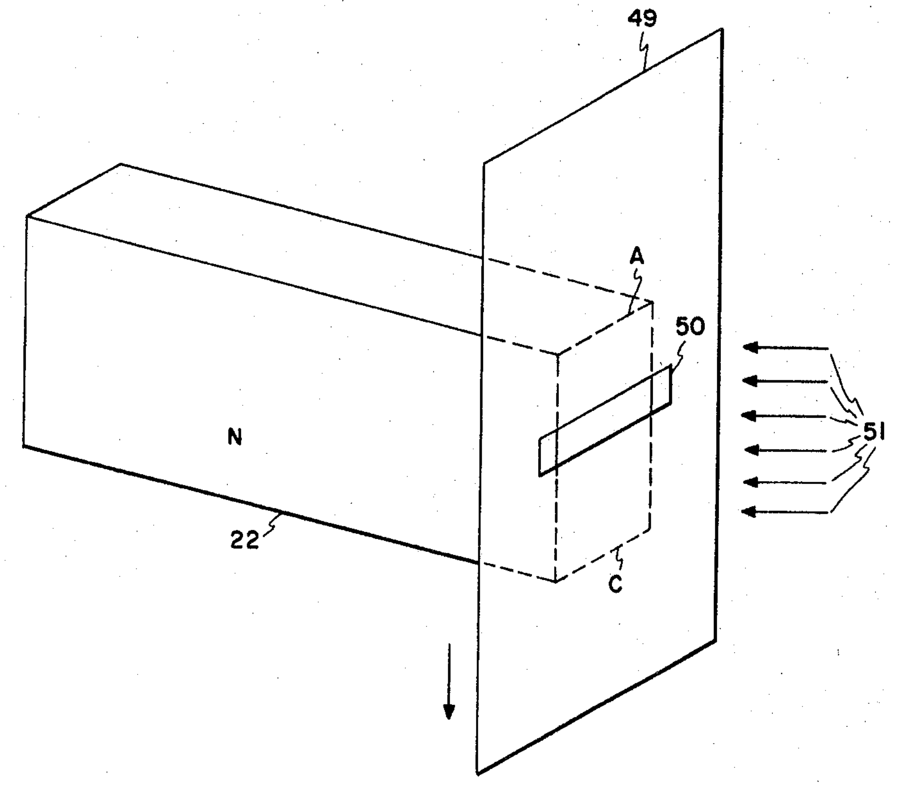
FIGURE 3 is a view of a step in the manufacture of a preferred embodiment of this invention.

In FIGURE 1 is seen triode 20 having a heavily doped N type layer 22 and a heavily doped P type layer 24 with junction 26, symbolically shown for purposes of explanation, being formed therebetween. Layers 22 and 24 may be germanium. The junction 26 is narrow at the top and larger at the bottom. The length L of the junction in this embodiment is approximately three mils and the width W of the P doped layer 24 is approximately one mil. One method of forming such a junction as shown in FIGURE 3 is to gradually move a shadow mask 49 so that slit 50 moves across the junction from A to C as the P layer 24 is vapor deposited, the vapor 51 being graphically illustrated in FIGURE 3, or epitaxially grown, on the N layer 22. At the same time the doping concentration is gradually decreased so that the concentration of carriers is highest near the top of junction 26 and the concentration gradually diminishes towards the lower portion of the junctions. Doping concentration for the P layer 24 preferably varies linearly from 6 x $10^{19}$ impurity particles per cubic centimeter at A to $10^{19}$ impurity particles per cubic centimeter at C. Doping concentration for the N layer 22 may typically be $10^{17}$ impurity particles per cubic centimeter.

Connected to the upper corner of layer 24 is a lead or terminal 28 of a circuit which includes a bias battery 30 and a transformer secondary 32, with a lower lead or terminal 34 being connected to the lower corner of layer 24. The input 36 is connected across the transformer primary 38. The width W of layer 24 is made narrow or thin enough so that the resistance of the layer between terminals 28 and 34 is sufficient to establish a desired potential gradient when a voltage is placed thereacross.

A third terminal 40 is connected to the end of N doped layer 22 with terminal 40 being in a circuit containing forward bias battery 42 and resistance 44 across which the output 46 is taken. The other end of resistance 44 is connetced to center tap 48 of secondary 32.

Figure 2:
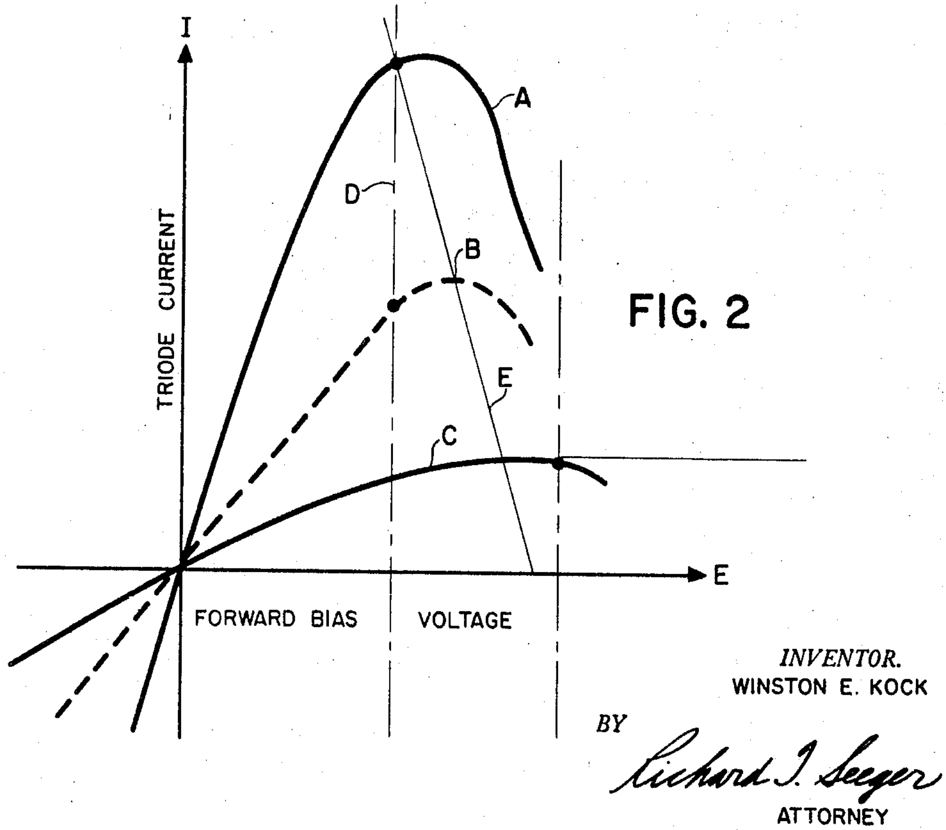
FIGURE 2 is a graph with the worward bias voltage indicated along the abscissa and the output current along the ordinate.

The operation of this embodiment will be described with the aid of FIGURE 2 which shows a plot of a current through the triode 20 versus the forward bias voltage for several different values of the voltage applied between terminals 28 and 34. The forward bias is supplied by battery 42 which causes a current to flow through triode 20. The height of the carrier path through junction 26 determines what value the current of carriers will be. The carriers, i.e., electrons since layer 22 is of N type impurity, pass more easily through an upper portion of the junction than they do through a lower portion, with the difficulty of carrier passage through the junction gradually increasing from the top of the junction to the bottom, and, therefore, the carrier volume, or current, is larger when the path is higher. For example, in FIGURE 2, curve A represents the current versus forward bias voltage for currents passing through the narrowest part (A) of junction 26, while Curve B represents the current voltage curve for a current passing through the (B) portion of junction 26, and curve C represents the current voltage curve for passing through the lowest and thickest portion (C) of junction 26. It will be realized that there is a different current-voltage curve for each thickness of junction 26 resulting in an infinite number of curves.

The tendency for an electron current passing through triode 20 would be to go through the narrowest or A point, but a negative voltage applied to terminal 28 will repel the current so that it travels through a lower part of the junction 26 and hence, be of a correspondingly lower value. The input 36 across transformer primary 38 controls the voltage at leads 28 and 34 and determines that portion of the junction 26 through which the triode current passes with the more negative the voltage at lead 28 relative to the voltage at lead 34, the lower the carrier passage will be along junction 26.

The bias battery 30 is placed in the circuit so that at zero input signal the triode current will pass at an intermediate point in the junction such as point B so that a positive input signal will cause the current to pass through a higher point of the junction 26 and a negative input current will cause the current to pass through a lower point of junction 26. With bias voltage from battery 42 but with no load resistance 44, the current output would follow a substantially vertical line such as line D in FIGURE 2 while presence of a load resistance 44 will cause the line to move to a position such as line E in FIGURE 2.

Briefly then, the operation is as follows: An input signal is applied at 36 to the primary 38 of a transformer having a secondary 32 which is connected between leads 28 and 34. This impresses a varying potential across the length L of P doped layer 24. The value of the impressed voltage will determine at what point along the length L the triode current will pass through junction 26. The more positive the potential applied to terminal 28 relative the potential applied to terminal 34, the higher the level at which the current will pass through junction 26, and the larger the current will be in the output circuit across resistance 44.

While at the present time the most effective tunneling devices utilize semiconductor materials, some tunneling has been observed through extremely thin insulating layers and these could be effective for use in the device of this invention.

Also, the following described materials and method of manufacturing the device of this invention may be used. The device shown in FIGURE 1 will be used to illustrate the following example. A sheet of aluminum forms layer 22 and this sheet may be dipped gradually into a bath of sodium hydroxide to form an aluminum oxide coating of increasing thickness which would form a barrier 26. The concentration and temperature of the sodium hydroxide bath are those used in the prior art for oxidizing aluminum. The sheet of aluminum, which has been previously coated with a commercial stop off material such as a photoresist on all portions but one end, is gradually immersed in the bath starting with one edge and inserting the sheet into the bath at a constant rate until the opposite edge is immersed. The oxide thickness which forms on the uncoated end preferably varies from 20 angstrom units at the edge that was the last to be immersed, to 60 angstrom units at the edge that was the first to be immersed.

Then aluminum would be evaporated on barrier 26 to form layer 24. The aluminum layer 24 would have a very narrow width W in order to develop a potential drop across its length L. The width W of layer 24 would depend on the length L and depth D of layer 24 and could be in order of 10 to 100 angstrom units. Here, the principle of operation would be the tunneling of electrons from one metallic layer 22 to a second metallic layer 24, through an insulative barrier 26. Materials other than aluminum, such as tantalum or gold, could be used.

Although this invention has been disclosed and illustrated with reference to particular applications, the principles involved are susceptible of numerous other applications which will be apparent to persons skilled in the art. The invention is, therefore, to be limited only as indicated by the scope of the appended claims.

Having thus described my invention, I claim:

1. Apparatus comprising a body having at least two layers of noninsulative material, a tunneling barrier being formed between two of said layers, means for connecting a first voltage source between two spaced points on one of said layers for establishing a voltage gradient along said one layer between said points, means for connecting a second voltage source between the other layer and said one layer to cause a carrier current flow in said body across said barrier, a voltage change of the first voltage source causing the position at which said carrier current crosses the barrier to change accordingly thereby providing means for controlling at which portion of the barrier between said spaced points the carrier current crosses said barrier, the resistance across said barrier at each of a plurality of points between said two spaced points being different than the resistance at any other of said plurality of points, the first voltage source determining at which of said plurality of points that said current flow passes thereby determining the value of said current flow providing a controllable tunnel current.

2. The apparatus of claim 1 wherein said layers are aluminum and said barrier is aluminum oxide.

3. Apparatus comprising a body having at least two layers of noninsulative material, a length of tunneling barrier between two of said layers, said tunnel barrier having at least two different areas of different resistance characteristics in a direction transverse to said length, and means to control which of said at least two areas of the barrier the carrier current crosses thereby resulting in at least two different magnitudes of the carrier current.

4. A semiconductor apparatus comprising a body having at least two layers of semiconductive material, a rectifying tunnel junction being formed between two of said layers, means for connecting a first voltage source between two spaced points on one of said layers of semiconductive material for establishing a voltage gradient along said one layer between said points, means for connecting a second voltage source between the other layer and said one layer to cause a carrier current flow in said body across said junction, a voltage change of said first voltage source causing the position at which said carrier current crosses the junction to change accordingly thereby providing means for controlling at which portion of the junction between said spaced points the carrier current crosses said junction, the resistance across said junction at each of a plurality of points between said two spaced points being different than the resistance at any of the other of said plurality of points, the first voltage source determining at which of said plurality of points that said current flow passes thereby determining the value of said current flow providing a controllable tunnel junction current.

5. The semiconductor claimed in claim 4 where the resistance across said junction at each of said plurality of points is determined by the thickness of the junction with the resistance varying directly with the thickness of the junction.

6. The semiconductor apparatus of claim 4 with said junction having a relatively heavy impurity concentration at one end thereof and a gradually decreasing impurity concentration from said one end to the other end.

7. The apparatus of claim 4 with said means for connecting a first voltage source between two points comprising a transformer having its primary connected to the input signal, its secondary being connected to said spaced points, a center tap of said secondary being connected to another of said layers of semiconductive material, a bias means being in said transformer secondary circuit so that with zero input signal to the transformer primary, carrier conduction will occur in an area intermediate of said spaced points.

8. The apparatus of claim 1 wherein said layers are doped semiconductor material and said barrier is a tunnel rectifying junction.

9. A thin film device comprising a tunneling barrier of finite length and of varying effective transverse electrical resistance along said length, and means for establishing a potential difference across said barrier the magnitude of which varies along said length.

10. The combination of claim 9 further including signal means for changing the variations of the magnitude of the potential difference along said length.

11. The combination of claim 9 in which said variation of the magnitude of the potential difference across said barrier is continuous.

12. The combination of claim 9 in which said barrier is of varying effective thickness.

13. The combination of claim 9 in which said barrier is semiconductive and has a varying impurity concentration along said length.

14. A thin film device comprising a pair of noninsulative elements, a tunneling barrier of finite length disposed between said elements and having an effective transverse resistance which varies along said length, means for establishing a potential gradient along a portion of the length of one of said elements, and means for varying the conductivity of said device comprising means for varying said potential gradient.

15. The combination of claim 14 in which said potential gradient is continuous.

16. The combination of claim 14 in which said barrier is a doped semiconductor material.

17. The combination of claim 14 in which said barrier is an extremely thin insulating layer.

18. The combination of claim 17 in which said insulating layer is aluminum oxide.

19. A controllable thin film trunnel device comprising an essentially homogeneous resistive layer, a noninsulative layer, a thin tunneling layer sandwiched between said resistive layer and said noninsulative layer and in electrical contact with each thereof, first and second electrical terminals connected to said resistive layer at spaced points thereon, a third terminal connected to said noninsulative layer, means for establishing an input circuit including said first terminal and said second terminal and the portion of said resistive layer therebetween, and means for establishing an output circuit including said third terminal and at least one of said first and second terminals.

References Cited

UNITED STATES PATENTS 3,056,073 9/1962 Mead ............ 317—234

FOREIGN PATENTS 1,060,881 7/1959 Germany.

JOHN W. HUCKERT, *Primary Examiner.*

R. SANDLER, *Assistant Examiner.*

U.S. Cl. X.R.

307—322; 317—234, 235